United States Patent
Muziol et al.

(10) Patent No.: US 12,308,588 B2
(45) Date of Patent: May 20, 2025

(54) TEMPERATURE-STABLE COMPOSITE OF A STRANDED WIRE HAVING A CONTACT PAD

(71) Applicant: Yageo Nexensos GmbH, Kleinostheim (DE)

(72) Inventors: Matthias Muziol, Kleinostheim (DE); Martin Bleifuß, Kleinostheim (DE)

(73) Assignee: Yageo Nexensos GmbH, Kleinostheim (DE)

(*) Notice: Subject to any disclaimer, the term of this patent is extended or adjusted under 35 U.S.C. 154(b) by 164 days.

(21) Appl. No.: 18/001,814

(22) PCT Filed: Jun. 14, 2021

(86) PCT No.: PCT/EP2021/065875
§ 371 (c)(1),
(2) Date: Dec. 14, 2022

(87) PCT Pub. No.: WO2021/254922
PCT Pub. Date: Dec. 23, 2021

(65) Prior Publication Data
US 2023/0318207 A1    Oct. 5, 2023

(30) Foreign Application Priority Data
Jun. 19, 2020 (EP) .................... 20181115

(51) Int. Cl.
*H01R 4/02* (2006.01)
*H01L 23/00* (2006.01)
*H01R 4/12* (2006.01)

(52) U.S. Cl.
CPC ............. *H01R 4/023* (2013.01); *H01L 24/43* (2013.01); *H01L 24/45* (2013.01); *H01L 24/49* (2013.01);
(Continued)

(58) Field of Classification Search
CPC .. H01R 4/02; H01R 4/023; H01R 4/12; H01L 24/43; H01L 24/45; H01L 24/49; H01L 24/85
(Continued)

(56) References Cited

U.S. PATENT DOCUMENTS

| 9,550,252 B2 | 1/2017 | Takayashiki |
| 2003/0135998 A1* | 7/2003 | Walz ............... H05K 3/107 427/97.8 |
| 2018/0047697 A1 | 2/2018 | Luedeke et al. |

FOREIGN PATENT DOCUMENTS

| DE | 102009020733 A1 | 11/2010 |
| DE | 102016105494 A1 | 9/2017 |

(Continued)

OTHER PUBLICATIONS

Eisele R, et al., "Reliable Chip Contact Joining" International Conference for Power Electronics, Intelligent Motion and Power Quality PCIM, Nurnberg May 13-15, 2009, May 13, 2009 (May 13, 2009), pp. 723-728 ISBN: 978-3-8007-3158-9. XP 009178960; figures 3-5, and the text disclosed in conjunction with these figures; figures 3, 5.

*Primary Examiner* — Tremesha W Burns
(74) *Attorney, Agent, or Firm* — Dicke, Billig & Czaja, PLLC

(57) ABSTRACT

The invention relates to an electrical element having at least one functional region and a contact surface, wherein a connecting element is arranged on the contact surface, wherein the connecting element comprises a stranded wire coated with sintered material, wherein the stranded wire is connected, in particular sintered, to the contact surface by a sintered material. Furthermore, the invention relates to a method for producing the electrical element according to the invention.

15 Claims, 4 Drawing Sheets

Figure 1:
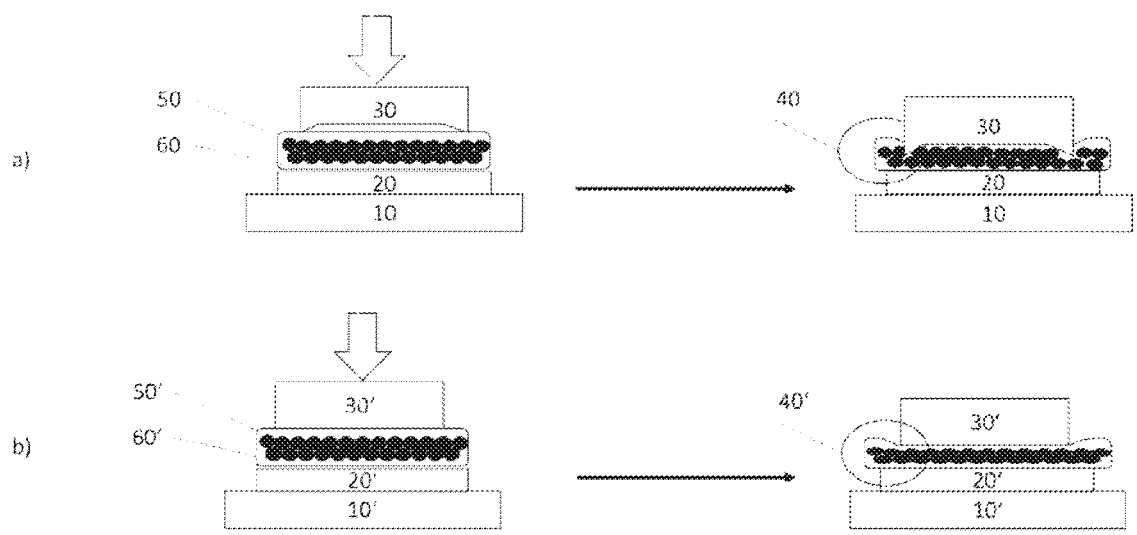

(52) U.S. Cl.
CPC ............... *H01L 24/85* (2013.01); *H01R 4/12* (2013.01); *H01L 24/78* (2013.01); *H01L 2224/43822* (2013.01); *H01L 2224/45026* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/45565* (2013.01); *H01L 2224/45639* (2013.01); *H01L 2224/45691* (2013.01); *H01L 2224/49111* (2013.01); *H01L 2224/78252* (2013.01); *H01L 2224/78315* (2013.01); *H01L 2224/85203* (2013.01); *H01L 2224/8584* (2013.01); *H01L 2924/351* (2013.01); *H01R 2201/20* (2013.01)

(58) Field of Classification Search
USPC ........................................................ 174/71 R
See application file for complete search history.

(56) References Cited

FOREIGN PATENT DOCUMENTS

| | | |
|---|---|---|
| JP | 2012192413 | 10/2012 |
| JP | 2016063179 A | 4/2016 |
| JP | 2018511175 | 4/2018 |

\* cited by examiner

TEMPERATURE-STABLE COMPOSITE OF A STRANDED WIRE HAVING A CONTACT PAD

The present invention relates to an electrical element on the contact surface of which a connecting element is arranged, wherein the connecting element comprises a stranded wire coated with sintered material. Furthermore, the invention relates to a method for producing a connecting element.

In electrical and electronic connection technology, connections in which wires are attached to bond pads are common. Known advantages are the proven technology, a high wire cross-section, and favorable manufacturing costs. Wires are usually attached to bond pads by soldering. The soldering alloys used in this case usually have a melting point below 250° C. and are therefore not suitable for applications which require temperatures of 300° C.

A disadvantage of connecting wires to bond pads by soldering is the lack of mechanical stability against vibrations since they are usually too rigid.

In the prior art, this is solved by the use of a stranded wire in the form of a ribbon instead of a wire. Stranded wires, e.g., in the form of a braided ribbon, are more flexible than wires and can better absorb vibrations. DE102009020733A1 describes a ribbon having a thickness of 100 µm and a width of 3 mm, which is attached to a bond pad by means of sintering technology. A higher temperature stability can be achieved by using sintering paste.

However, there are disadvantages associated with the use of stranded wires in the form of a ribbon. In order to achieve a sufficiently high wire cross-section, a ribbon that has a high contact surface to a contact pad is required. This makes it unsuitable for applications in which very small contact pads that are very close together are to be contacted electrically and mechanically.

The ribbon in the prior art is connected to a contact pad by means of pressure sintering. A heated punch with a flat pressure surface is used for pressure sintering (FIG. 1b)).

Alternatively used is a heated punch that comprises an elevation at the edge and that has a smaller pressure surface than the ribbon to be contacted. As a result, a higher pressure is generated locally by the elevated edge region during pressure sintering. This is shown by way of example in FIG. 1a).

A disadvantage of a punch having a flat pressure surface or a pressure surface with elevations in the edge region is that, due to the pressure sintering, the stranded wire is squeezed farther apart. As a result of the squeezing-apart, the stranded wire becomes even wider on the contact surface and can even be pressed beyond the surface of the contact surface. The squeezed edge regions 40, 40' are shown schematically in FIG. 1.

It was an aim of the present invention to provide an improved connecting element for an electrical element that can be attached to as small a contact surface as possible in a mechanically and thermally stable manner.

In particular, it was an aim to provide a connecting element that covers as completely as possible a contact surface to be connected to the connecting element. In particular, the coverage of the contact surface with the connecting element should be at least 80%.

In particular, it was an aim of the invention to provide a connecting element that is mechanically stable at temperatures of at least 250° C., in particular at least 300° C.

A further aim of the invention was to provide methods with which a stranded wire can be connected to a contact surface in as space-saving a manner as possible without decreasing the wire cross-section of the stranded wire in the process.

At least one aim is achieved by the subject matters of the category-forming claims.

In a first aspect, the invention relates to an electrical element having at least one functional region and a contact surface, wherein a connecting element is arranged on the contact surface, wherein the connecting element comprises a stranded wire coated with sintered material, wherein the stranded wire is connected, in particular sintered, to the contact surface by a sintered material, characterized in that the aspect ratio of the connecting element of height (h) to width (b) is in the range of 0.5 to 3.

The invention makes it possible for the first time to provide a connecting element on small contact surfaces with a simultaneously high wire cross-section.

The stranded wire enables a flexible connection with high mechanical stability against vibrations. The sintered material of the connecting element ensures high temperature stability.

The electrical element according to the invention can be an electrical component or an electronic component. Electrical components are preferably designed to transport, control, or change energy in the form of electricity. Electronic components are preferably designed to transport, control, or change information in the form of electricity. Examples of electronic components are semiconductor chips.

According to the invention, the electrical element comprises a functional region and a contact surface. The electrical element is preferably located on the surface of a substrate, in particular of an insulating substrate. The insulating substrate can be plate-like. The material of the insulating substrate can be selected from ceramics, such as aluminum oxide ceramics.

The functional region of the electrical element is not further limited according to the invention. The functional region can be selected from semiconductor components, electronic components, multi-sensor platforms, resistors, capacitors, sensors, LEDs, or heaters.

The sensor can be a resistor structure, for example. The resistor structure can preferably be meandering, wound, serrated, or designed as interlocking finger structures.

The resistor structure can comprise or consist of a precious metal. The precious metal can be selected from the group consisting of gold, silver, platinum, palladium, and iridium.

The resistor structure can be applied to a substrate by means of thin-film technologies, e.g., by means of PVD (physical vapor deposition). The height of the resistor structure on the substrate can preferably be in the range of 0.1 mm to 1 mm, in particular in the range of 0.25 mm to 0.75 mm.

Furthermore, the electrical element comprises a contact surface. The contact surface can be located on a portion of the functional region or be separate from the functional region on a contact region of the electrical element that is different from the functional region. The contact region can be a contact pad, e.g., a bond pad.

The contact surface preferably contains or consists of a sinterable material. The sinterable material can contain or consist of metal. The metal can preferably be selected from the group consisting of precious metals or non-precious metals.

Precious metals can be selected from the group consisting of gold, silver, platinum, palladium, or iridium.

Non-precious metals can be selected from the group consisting of copper or nickel.

The metal can comprise or consist of an elemental metal or an alloy.

In a preferred embodiment, the metal is an alloy. The alloy can contain a precious metal selected from the group consisting of gold, silver, platinum, palladium, or iridium. The alloy preferably contains two or more precious metals. For example, the alloy can be a silver alloy or a silver-platinum alloy. In another embodiment, the alloy can contain at least one precious metal and at least one non-precious metal. The alloy may optionally contain both precious metal and non-precious metal. Furthermore, it is possible for the alloy to comprise non-metals.

The surface of the contact surface is not limited further according to the invention. In a preferred embodiment, the contact surface in a first direction has a dimension of no more than 10 mm, in particular no more than 2 mm, and very particularly preferably no more than 0.5 mm.

In another embodiment, the contact surface in a second direction perpendicular to the first direction has a dimension of no more than 30 mm or no more than 10 mm, in particular no more than 5 mm, and very particularly preferably no more than 1.5 mm.

The shape of the contact surface is not limited further. For example, the contact surface can be round or angular, in particular rectangular.

In one possible embodiment, the contact surface is flat or curved. A curved contact surface has a three-dimensional structure.

According to the invention, a connecting element is arranged on the contact surface. The connecting element is preferably sintered to the contact surface.

Sintered materials are preferably produced from individual particles which are heated to a temperature below their melting temperature. During the sintering process, atoms or molecules of the particle preferably diffuse toward the contact points of adjacent particles. The formation of an integral connection thus ensues at the contact points during sintering. If metals are sintered, the electrical conductivity of the particle composite can be increased by the formation of metallic connections between individual particles. Since the particles are heated to a temperature below the melting temperature, the particle morphology, e.g., shape or size, is maintained at least in part.

Preferably, the connecting element, in particular the connecting element sintered to the contact surface, covers at least 50% or at least 60 or at least 70% or at least 80% of the contact surface. In particular, the connecting element covers at least 90% or very particularly preferably 100% of the contact surface.

In one possible embodiment, the connecting element completely covers the contact surface and projects at most 10% or at most 30% beyond the contact surface.

According to the invention, the connecting element comprises a stranded wire coated with sintered material. A stranded wire contains several individual wires. In particular, the stranded wire contains a bundle of individual wires. The stranded wire preferably contains at least five individual wires. Furthermore, the stranded wire contains preferably at most 50, in particular at most 30, and very particularly preferably at most 20 individual wires. The stranded wire particularly preferably contains 7 to 19 individual wires, in particular consists of 7 or 19 individual wires.

The individual wires combined to form a bundle can, for example, be twisted, stranded, or braided together. Particularly preferred are stranded wires.

The diameter of the individual wires can preferably be in the range of 0.1 mm to 0.3 mm.

In one embodiment of the invention, the individual wires contain a metal. In particular, the metal of the individual wires can be an elemental metal or a metal alloy. The metal can be selected from elements of the group consisting of gold, platinum, silver, copper, aluminum, or nickel, or a combination of at least two of these elements. In particular, the individual wires comprise or consist of a non-precious metal. The metal of the individual wires is particularly preferably copper.

In one possible embodiment, the individual wires of the stranded wire are coated, e.g., with silver. The individual wires are coated before the stranded wire is produced from the individual wires. The stranded wire can be coated using galvanic methods. The coating of the individual wires preferably has a thickness in the range of 0.2 to 2 μm, in particular in the range of 0.5 to 2 μm.

The sintered material preferably contains a plurality of powder particles sintered together, each sintered to adjacent particles. In contrast to molten or soldered materials, the particles are preferably not melted, or only partially melted, during sintering.

The particle morphology of the individual particles is preferably preserved in the sintered material and can be determined using analytical methods known to the person skilled in the art of powder metallurgy. For example, the sintered particles can be determined using suitable microscopic methods, such as light microscopy or electron microscopy The sintered material can completely surround the stranded wire. The sintered material is preferably not only on the surface of the stranded wire, i.e., the bundle of individual wires, but at least partially surrounds the individual wires of the stranded wire. The sintered material containing sintered particles is preferably also sintered to the material of the individual wires.

Furthermore, the sintered material preferably also comprises a sintered connection to the contact surface.

In a particularly preferred embodiment of the invention, the sintered material of the connecting element is sintered approximately homogeneously and comprises no regions that are particularly less sintered or particularly strongly sintered. In this context, reference is made to FIG. 1, which represents the prior art. In FIG. 1a), a punch with an edge elevation is pressed onto a ribbon with sintering agent. The pressure of the punch is high in the region of the edge elevation so that the sintering agent is sintered particularly strongly there and forms a dense, sintered material. In contrast, the sintered material has a lower density in the regions in which the ribbon was not pressed by the edge elevation. In comparison, the sintered material of the present invention is substantially homogeneous over the region of the connecting element and has a substantially constant density.

In a particularly preferred embodiment, the individual wires of the stranded wire are embedded in the sintered material and are in contact with the contact surface via the sintered material.

The connecting element having a stranded wire and a sintered material, arranged on the contact surface, exhibits an aspect ratio of 0.5 to 3 in cross-section, i.e., perpendicular to the main extension direction of the stranded wire. The aspect ratio is calculated from the ratio of the height (h) of the connecting element to the width (b) of the connecting element. The height (h) is measured from the surface of the contact surface to the highest point of the connecting element. The width (b) of the connecting element is measured perpendicularly to the height (h) at the interface between the contact surface and the connecting element. This is shown by way of example in FIG. 3. The height of the connecting element is designated (h), and the width is designated (b). The aspect ratio is calculated by (h)/(b).

A high aspect ratio is advantageous since the contacting of the contact surface by the connecting element requires little space. This is advantageous in the case of contact surfaces that are very close to each other since short circuits are avoided without significantly reducing the wire cross-section.

Preferably, the connecting element can produce a mechanically stable connection up to a temperature of at least 300° C.

In a further aspect, the invention relates to a method for producing a connecting element on a contact surface, having the steps of:
a) providing a stranded wire, a contact surface on an electrical element, and a sintering agent,
b) coating at least a part of the stranded wire with sintering agent to obtain a coated stranded wire,
c) positioning the coated stranded wire on the contact surface,
d) connecting the coated stranded wire to the contact surface by means of pressure sintering using a heated punch, to produce a connecting element, characterized in that the heated punch comprises a depression with an opening, wherein the depression in the punch partially receives the coated stranded wire during the connection process, and wherein the opening of the depression is larger than the diameter of the coated stranded wire so that the coated stranded wire is pressed onto the contact surface into the depression in the punch during pressure sintering.

In step a), a stranded wire is provided according to the invention. The stranded wire is preferably to be understood as a bundle of several individual wires. The individual wires can be twisted, stranded, or braided together. The individual wires of the stranded wire are particularly preferably stranded together. The bundle of individual wires is preferably approximately round. In particular, in the cross-section of the stranded wire, the ratio between the shortest diameter to the longest diameter is in the range of 0.5 to 1.5, in particular in the range of 0.8 to 1.

In cross-section, the stranded wire, in particular the entirety of the individual wires combined to form the bundle, preferably has a diameter in the range of 0.1 mm to 2 mm, in particular in the range of 0.3 mm to 1.5 mm, and very particularly preferably in the range of 0.25 mm to 0.6 mm.

In a preferred embodiment, the stranded wire has a diameter that does not deviate more than 20% from the width of the contact surface.

Preferably, the stranded wire comprises an electrical insulating layer at least in regions on its outer surface. For example, the stranded wire is at least partially wrapped by an electrical insulating layer. In one possible embodiment, the stranded wire is not surrounded by an electrical insulating layer at one end. In this case, the individual wires of the stranded wire are exposed and can be electrically contacted. This can be achieved, for example, by subsequently stripping a stranded wire with an electrical insulating layer. For example, the last 0.5 mm to 5 mm of a stranded wire may be free of insulating layer.

The material of the insulating layer can be selected from the group consisting of plastics, such as thermoplastics, thermosets, elastomers, or glass-fiber materials (e.g., glass silk). The insulating layer may be an insulating lacquer. In one possible embodiment of the invention, the insulating layer contains or consists of polyimide (Kapton™).

Alternatively, it is also conceivable for the stranded wire to comprise an interruption in a substantially continuous insulating layer. The interruption of the insulating layer may preferably not be at the end of the stranded wire. The individual wires of the stranded wire are accessible and electrically contactable at the point of the interruption of the insulating layer.

Furthermore, a contact surface is provided on an electrical element. The electrical element preferably contains a functional region as described in this application.

Furthermore, the electrical element comprises a contact surface. The contact surface can be located on a portion of the functional region or be separate from the functional region on a contact region of the electrical element that is different from the functional region. The contact region can be a contact pad, for example.

Furthermore, a sintering agent is provided in step a). The sintering agent preferably contains a sinterable metal, in particular a precious metal. The sintering agent particularly preferably contains silver.

The sintering agent can be a sintering paste, for example. A sintering paste contains metal particles. The metal particles can, for example, comprise spherical particles or flakes. Particularly preferably, the sintering paste contains silver flakes (Ag flakes).

Furthermore, a sintering paste contains organic components. The organic components may be selected from the group consisting of organic solvents, dispersants, rheology agents, wetting agents, or any combination of said components. The sintering paste preferably contains at least one organic solvent.

Preferred organic components are selected from terpineol and 2-ethylhexane-1,3-diol.

Optionally, the sintering paste can contain further particles, which either can be sintered or cannot form a sintered connection, in particular not under the conditions in which the sinterable metal particles can be sintered.

In a preferred embodiment, the sintering paste contains less than 10 wt. %, in particular less than 5 wt. % or less than 1 wt. %, of particles that are not metal-based particles, in particular not metal particles.

In step b), the stranded wire is coated with sintering agent to obtain a coated stranded wire. In particular, the stranded wire is coated with a sintering paste.

In a preferred embodiment of the invention, the stranded wire is coated with sintering paste in such a way that the individual wires of the stranded wire are at least partially or completely surrounded by sintering agent, in particular sintering paste. In other words, the stranded wire is immersed in the sintering agent or saturated therewith. In one possible embodiment, the intermediate spaces between the individual wires are filled with sintering agent by the coating of the stranded wire.

The stranded wire is preferably coated with sintering agent by saturating or dip coating. For this purpose, an end of the stranded wire that has no insulating layer can be immersed in a sintering paste, for example.

Optionally, the coated stranded wire can be dried, in particular if the sintering agent is a sintering paste. Drying can take place at a temperature in the range of 20° C. to 200° C.

Furthermore, in step c), the coated stranded wire is positioned on the contact surface. Preferably, the stranded wire is positioned such that it contacts only the contact surface.

In step d), the coated stranded wire is connected to the contact surface by means of pressure sintering using a heated punch, to produce a connecting element.

During the pressure sintering, a heated punch exerts a high pressure on the coated stranded wire so that the sintering agent is sintered to itself. This means that the powder particles of the sintering agent preferably connect to one another and produce a continuous structure. The sintering agent is converted into a sintered material by means of pressure sintering. Due to the increased temperature, existing organic components of the sintering agent, in particular the sintering paste, are at least partially removed. During the pressure sintering, the organic components can decompose or evaporate to form volatile, gaseous substances.

The temperature of the pressure sintering is not limited further according to the invention and is dependent upon the sintering agent used. The temperature to be set for the respective sintering agent is known to the person skilled in the art of electrical connection technology. For example, a silver-containing sintering paste can be sintered at a temperature in the range of 300° C. to 500° C.

It is also advantageous to heat the substrate on which the contact surface is located, prior to the pressure sintering, preferably to a temperature which is below the sintering temperature.

The pressure that is exerted by the heated punch during the pressure sintering is not limited according to the invention and is dependent upon the sintering agent used in each case. The preferred pressure for pressure sintering is, for example, in the range of 20 $N/mm^2$ to 60 $N/mm^2$.

The duration of the pressure sintering can be in the range of 0.5 seconds to 60 seconds, preferably in the range of 5 seconds to 20 seconds.

The sintering agent is preferably sintered in the coated regions to the stranded wire, in particular to several or all individual wires of the stranded wire.

Furthermore preferably, the sintering agent also forms a sintered connection to the contact surface, whereby a connecting element according to the present invention is produced.

In the connecting element, the individual wires of the stranded wire are preferably embedded in a matrix of sintered material and are mechanically firmly anchored on the contact surface. Furthermore, the sintered connecting element can have high electrical and/or thermal conductivity.

According to the invention, the heated punch contains a depression with an opening. The depression in the punch is designed such that the coated stranded wire can be partially received in the depression during the connection process. Because the coated stranded wire can be received in the depression during pressure sintering, the position of the connecting element to be produced can be determined very precisely.

The opening of the depression is greater than the diameter of the coated stranded wire so that the coated stranded wire is pressed into the depression in the punch and onto the contact surface during pressure sintering. Since the diameter of the depression is greater than the diameter of the coated stranded wire, the edge regions around the depression do not exert any pressure on the coated stranded wire.

Because the diameter of the opening of the depression is greater than the diameter of the stranded wire, the depression for the coated stranded wire preferably constitutes a boundary so that the coated stranded wire is not pressed beyond the contact surface.

Because the depression according to the invention exhibits the dimensions mentioned, the coated stranded wire and the resulting connecting element can be formed such that it can have an aspect ratio of width (b) to height (h) in the range of 0.5 to 3.

The coated stranded wire is preferably pressed into the depression in the heated punch and deformed in such a way that the stranded wire and the sintering agent take on the shape of the depression.

The depression preferably has a depth (t) and a width (w). The depth (t) is determined by the maximum distance of a straight connecting line between the edge regions of the opening and the lowest point of the depression. The width (w) indicates the distance between opposite edges of the opening.

The shape of the depression is not limited further according to the invention. The depression is preferably in the shape of a notch, which can preferably receive the coated stranded wire. For example, the cross-section of the depression can have a triangular, trapezoidal, rectangular, or round shape. In the figure, a trapezoidal cross-section of a depression in a punch is shown, for example.

Figure 4:
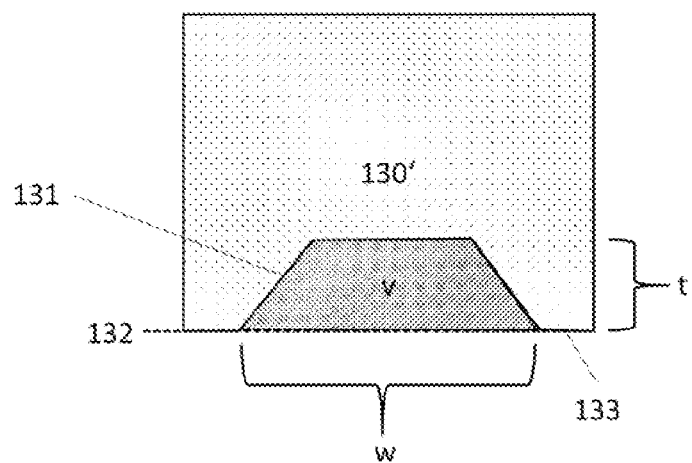

The variables (t) and (w) are shown in FIG. 4 by way of example. The hatched region marked (v) in FIG. 4 shows the volume of the depression.

The aspect ratio of the depth (t) to the width (w), (t)/(w), is preferably in the range of 0.5 to 3, in particular in the range of 1 to 2.

Preferably, the volume (v) is smaller than the volume of the coated stranded wire so that the heated punch can exert pressure on the coated stranded wire during pressure sintering. In particular, the volume v of the depression is at most 10% smaller, in particular at most 5% smaller, than the volume of the coated stranded wire.

The punch surface, which comes into contact with the sintering agent during the pressure sintering, preferably comprises a non-stick coating so that the sintering agent is not sintered to the surface of the punch. For example, the punch surface can consist of a copper alloy coated with an iron layer and, additionally, with a chromium/nickel layer.

Optionally, the connecting element obtained may be encapsulated with an electrically insulating material. This can be advantageous in order to protect the connecting element from environmental influences, such as oxygen or moisture, and thus increase the service life of the connecting element.

In a preferred development of the invention, a heated punch can have several depressions. As a result, the process according to the invention can be parallelized since a punch can be used to produce several connecting elements simultaneously by means of pressure sintering. This can be useful in particular when the electrical element to be connected comprises several contact surfaces, each of which is to be connected via a connecting element according to the invention.

Further features and advantages of the invention become apparent from the following description, in which preferred embodiments of the invention are explained with reference to schematic drawings.

Figure 2:
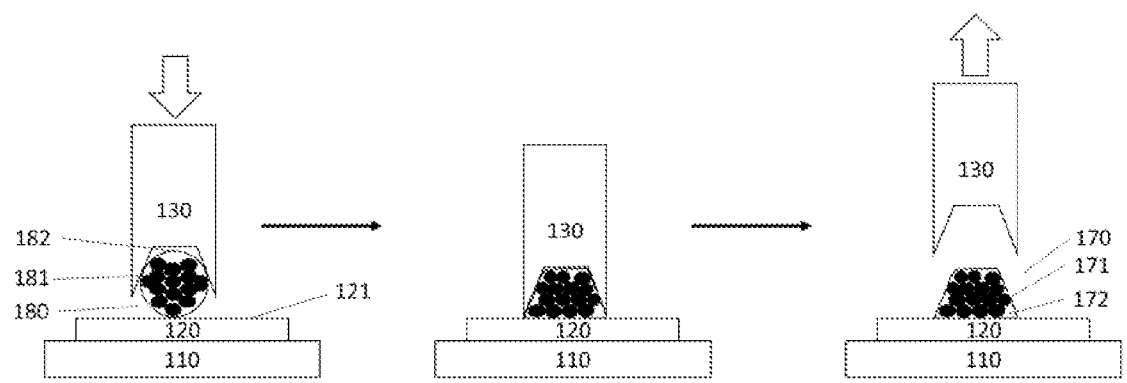
Figure 3:
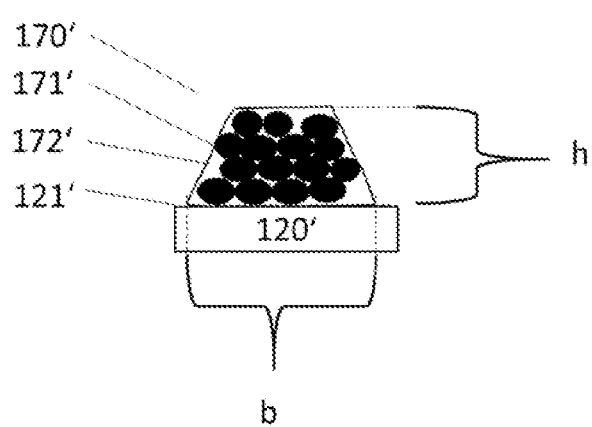

The Following are Shown:

FIG. 1 a sketch of the method from the prior art, in which a ribbon cable is fastened to a contact pad;

FIG. 2 a schematic illustration of the method according to the invention, in which a coated stranded wire is fastened to a contact pad using a heated punch;

FIG. 3 a cross-section of an embodiment of the connecting element according to the invention;

FIG. 4 a cross-section of an embodiment of a punch used according to the invention.

FIG. 1 illustrates the prior art. In FIG. 1a), a stranded wire 50 in the form of a ribbon coated with sintering agent 60 is positioned on a contact pad 20, wherein the contact pad is arranged on a substrate 10. The coated stranded wire is sintered to the contact pad by the heated punch 30. The heated punch 30 has an elevated edge. The circled region 40 represents sintered material and stranded wires that have been squeezed out.

In FIG. 1b), a stranded wire 50' in the form of a ribbon coated with sintering agent 60' is positioned on a contact pad 20', wherein the contact pad is arranged on a substrate 10'. The coated stranded wire is sintered to the contact pad by means of the heated punch 30'. The heated punch 30' has a planar pressure surface. The circled region 40' represents squeezed-out, sintered material and stranded wires.

FIG. 2 schematically shows the exemplary sequence of the method according to the invention. First, a coated stranded wire 180 having an approximately round shape is positioned on a contact surface 121 of a contact pad 120. The contact pad 120 is fastened to a substrate 110. The stranded wire comprises a stranded wire 181 consisting of individual wires. The stranded wire is coated with sintering agent 182. Pressure is exerted on the coated stranded wire by means of the heated punch 130. The coated stranded wire 180 is thereby deformed and adapts to the depression in the heated punch 130. Since the opening of the depression in the heated punch 130 is greater than the diameter of the coated stranded wire 180, the coated and deformed stranded wire is delimited by the depression. The heated punch 130 exerts pressure on the stranded wire until the sintering agent 171 is sintered to the stranded wire and the contact surface 121. Subsequently, the heated punch 130 is lifted, and the resulting connecting element 170 is thus exposed. The connecting element 170 comprises a stranded wire 171 and sintered material 172.

FIG. 3 shows a cross-section of a connecting element 170' according to the invention on a contact surface 121' of a contact pad 120'. The connecting element has a width (b) in the contact region with the contact surface 121'. Furthermore, the connecting element has a height (h), which is measured from the contact surface 121' to the highest point of the connecting element.

FIG. 4 schematically illustrates an exemplary heated punch 130'. The heated punch has an imaginary plane 132 which runs through the edge regions 133 of the opening. The opening in the heated punch 130' has a width (w) along the imaginary plane 132 and between the edge regions of the 133. The depression 131 has a depth (t) which extends from the imaginary plane 132 to the lowest point of the depression 131. The volume (v) of the depression 131 is limited by the imaginary plane 132.

LIST OF REFERENCE SIGNS

| | |
|---|---|
| 10, 10' | Substrate |
| 20, 20' | Contact pad |
| 30, 30' | Heated punch |
| 40, 40' | Edge region after the pressure sintering |
| 50, 50' | Stranded wire consisting of individual wires |
| 60, 60' | Sintering agent |
| 110, 110' | Substrate |
| 120, 120' | Contact pad |
| 121, 121' | Contact surface |
| 130, 130' | Heated punch |
| 131 | Depression |
| 132 | Imaginary plane of the opening of the depression running through the edge regions 133 |
| 133 | Edge region of the depression |
| 170, 170' | Connecting element |
| 171, 171' | Stranded wire consisting of individual wires |
| 172, 172' | Sintered material |
| 180 | Coated stranded wire |
| 181 | Stranded wire consisting of individual wires |
| 182 | Sintering agent |
| b | Width of connecting element |
| h | Height of connecting element |
| w | Width of the opening of the depression in the heated punch |
| t | Depth of the depression |

EXAMPLES

Exemplary Embodiment 1

A Pt thermistor was provided as a temperature sensor, e.g., a PT1000 designated as SMD-FC 0805 (Heraeus Nexensos GmbH, Germany). The size of the sensor was 2.1 mm×1.35 mm (W×L). The thermistor was applied to an aluminum oxide substrate.

The contact pads consisted of a screen-printed Ag—Pt alloy and contacted the Pt resistor structure at its ends. The contact surface of the contact pads was 0.5 mm×1.35 mm.

Two stranded wires having a diameter of 0.48 mm were used as the feed line. Each of the two stranded wires consisted of 19 individual copper wires having a diameter of 0.1 mm each. The individual copper wires were coated with a thin silver layer.

The stranded wires had insulation made of PTFE. At one end of each stranded wire, the insulation was removed by cutting in and pulling off in order to produce a contact region that is approximately 1.5 mm long.

The free ends of the stranded wire were immersed in a sintering paste (HERAEUS ASP 295-09P9) and then each positioned centrally on the two contact pads. The temperature sensor had a temperature of approximately 250° C. The temperature sensor was on a holder heated from below. The punch for pressure sintering the stranded wire ends, which were impregnated with sintering paste, to the contact pad had a rectangular punch surface which was adapted to the surface of the temperature sensor and was approximately 2 mm×3 mm (W×L) in size. There were two parallel, longitudinal notches in the punch surface. The longitudinal notches had a trapezoidal cross-section. The depth of the longitudinal notch was 0.3 mm, and the width of the opening was 0.5 mm.

While the sintering paste dried, the punch heated to 350° C. was lowered and pressed at a pressure of approx. 40 N/mm$^2$ onto the two stranded wire ends impregnated with sintering paste. The stranded wire ends were deformed according to the structure predetermined by the longitudinal notches. The pressure was applied to the sintering paste with the stranded wire for about 10 seconds. The punch was then lifted off the connecting element produced. The punch surface, which consisted of oxidized copper alloy, was free of residues from the sintering paste, even after repeated use.

In a tensile test in which the temperature sensor was fixed, a rising tensile force was applied in the main axis of the stranded wire, i.e., in parallel to the surface of the sensor surface, using a tensile tester. The tensile strength of the connection was determined at the moment at which the connection detached. The tensile strength determined was 30 N.

In a permanent storage test, a temperature sensor with the connecting element according to the invention was stored for 140 hours at a temperature of 250° C. After completion of the temperature treatment, the connections had not detached.

In a change test, a temperature sensor having a connecting element according to the invention was cooled 40 times from 250° C. to 22° C. The connections did not detach.

Comparative Example

In contrast to exemplary embodiment 1, a punch having a flat surface, i.e., a planar punch surface, was used for pressure sintering the connecting element.

The stranded wire ends were pressed flat and spread out so that the individual wires projected far beyond the contact pad.

The invention claimed is:

1. A method for producing a connecting element on a contact surface, comprising: a. providing a stranded wire, a contact surface, and a sintering agent, b. coating at least a part of the stranded wire with sintering agent to obtain a coated stranded wire, c. positioning the coated stranded wire on the contact surface, d. exerting pressure on the coated stranded wire by means of a heated punch, thereby pressure sintering the coated stranded wire to the contact surface to produce a connecting element, wherein the heated punch comprises a depression with an opening, wherein the depression in the heated punch partially receives the coated stranded wire during the connection process, wherein the opening of the depression is larger than the diameter of the coated stranded wire so that the coated stranded wire is pressed onto the contact surface into the depression in the punch during pressure sintering, and wherein the aspect ratio of the connecting element of height (h) to width (b) is in the range of 0.5 to 3.

2. The method of claim 1, further comprising providing an electrical element having at least one functional region and the contact surface, and arranging the connecting element on the contact surface.

3. The method of claim 2, wherein the electrical element is an electrical or electronic component or a sensor.

4. The method of claim 1, wherein the sintering agent comprises or consists of a precious metal, or silver.

5. The method of claim 1, wherein the stranded wire outside the connecting element is surrounded at least partially by an insulating layer.

6. The method of claim 1, wherein the stranded wire contains several individual wires, and wherein the individual wires are each at least partially coated with sintered material.

7. The method of claim 1, wherein the stranded wire contains several individual wires comprising a material selected from the group consisting of copper, silver, gold, nickel, or aluminum, or alloys thereof or combinations thereof.

8. The method of claim 1, wherein the contact surface in at least one dimension is at most 20% greater than the height of the connecting element.

9. The method of claim 1, wherein the contact surface comprises an alloy, or a silver alloy or a silver-platinum alloy.

10. Method according to claim 1, wherein the aspect ratio between the depth (t) of the depression to the width (w) of the opening of the depression is in the range of 0.5 to 3.

11. Method according to claim 1, wherein the stranded wire is at least partially surrounded by an insulating layer.

12. Method according to claim 1, wherein the stranded wire is coated with sintering agent by saturating, in particular by a dip coating.

13. Method according to claim 1, wherein the stranded wire has a cross-section whose aspect ratio is in the range of 0.5 to 2.

14. Method according to claim 1, wherein the individual wires of the stranded wire are stranded or braided.

15. Method according to claim 1, wherein the stranded wire is at least partially saturated with sintering agent so that the individual wires of the stranded wire are coated substantially completely with sintering agent.

* * * * *